US012278283B2

(12) United States Patent
Iucolano et al.

(10) Patent No.: US 12,278,283 B2
(45) Date of Patent: Apr. 15, 2025

(54) HEMT TRANSISTOR INCLUDING AN IMPROVED GATE REGION AND RELATED MANUFACTURING PROCESS

(71) Applicant: STMICROELECTRONICS S.r.l., Agrate Brianza (IT)

(72) Inventors: Ferdinando Iucolano, Gravina di Catania (IT); Cristina Tringali, Augusta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/477,372

(22) Filed: Sep. 28, 2023

(65) Prior Publication Data
US 2024/0021718 A1 Jan. 18, 2024

Related U.S. Application Data

(62) Division of application No. 16/706,539, filed on Dec. 6, 2019, now Pat. No. 11,799,025.

(30) Foreign Application Priority Data

Dec. 13, 2018 (IT) ........................ 102018000011065

(51) Int. Cl.
*H01L 29/66* (2006.01)
*H01L 21/285* (2006.01)
(Continued)

(52) U.S. Cl.
CPC .... *H01L 29/7786* (2013.01); *H01L 21/28581* (2013.01); *H01L 29/0649* (2013.01);
(Continued)

(58) Field of Classification Search
None
See application file for complete search history.

(56) References Cited

U.S. PATENT DOCUMENTS

2005/0151255 A1   7/2005   Ando et al.
2010/0244178 A1   9/2010   Huang
(Continued)

FOREIGN PATENT DOCUMENTS

CN   103219239 A   7/2013
CN   103426914 A   12/2013
(Continued)

OTHER PUBLICATIONS

"Electrical resistivity and Conductivity," Wikipedia, archived Dec. 27, 2022, 1 https://en.wikipedia.org/w/index.phptitle=Electrical_resistivity_and_conductivity&oldid=1 129918939, download date Oct. 18, 2018. (18 pages).
(Continued)

*Primary Examiner* — Grant S Withers
(74) *Attorney, Agent, or Firm* — Seed IP Law Group LLP

(57) ABSTRACT

An HEMT includes a semiconductor body, which includes a semiconductor heterostructure, and a conductive gate region. The gate region includes: a contact region, which is made of a first metal material and contacts the semiconductor body to form a Schottky junction; a barrier region, which is made of a second metal material and is set on the contact region; and a top region, which extends on the barrier region and is made of a third metal material, which has a resistivity lower than the resistivity of the first metal material. The HEMT moreover comprises a dielectric region, which includes at least one front dielectric subregion, which extends over the contact region, delimiting a front opening that gives out onto the contact region; and wherein the barrier region extends into the front opening and over at least part of the front dielectric subregion.

18 Claims, 11 Drawing Sheets

(51) Int. Cl.
*H01L 29/06* (2006.01)
*H01L 29/47* (2006.01)
*H01L 29/778* (2006.01)
*H01L 29/20* (2006.01)
*H01L 29/205* (2006.01)

(52) U.S. Cl.
CPC ...... *H01L 29/475* (2013.01); *H01L 29/66462* (2013.01); *H01L 29/7787* (2013.01); *H01L 29/2003* (2013.01); *H01L 29/205* (2013.01)

(56) References Cited

U.S. PATENT DOCUMENTS

| | | |
|---|---|---|
| 2011/0278590 A1 | 11/2011 | Mieczkowski et al. |
| 2013/0082307 A1 | 4/2013 | Okamoto et al. |
| 2013/0248873 A1 | 9/2013 | Kuraguchi et al. |
| 2013/0260517 A1 | 10/2013 | Komatani |
| 2013/0292790 A1 | 11/2013 | Minoura et al. |
| 2014/0092636 A1 | 4/2014 | Kanamura et al. |
| 2015/0021667 A1 | 1/2015 | Liu et al. |
| 2015/0028345 A1 | 1/2015 | Wong et al. |
| 2015/0162424 A1 | 6/2015 | Briere |
| 2017/0294530 A1 | 10/2017 | Moens et al. |
| 2018/0090584 A1* | 3/2018 | Sumiyoshi ........ H01L 29/66462 |
| 2018/0240754 A1 | 8/2018 | LaRoche et al. |

FOREIGN PATENT DOCUMENTS

| | | |
|---|---|---|
| CN | 106711039 A | 5/2017 |
| EP | 3836228 A1 | 6/2021 |
| JP | 2003209127 A | 7/2003 |
| JP | 2011238805 A | 11/2011 |
| JP | 2012216877 A | 11/2012 |

OTHER PUBLICATIONS

"Work Function," archived Dec. 7, 2022, Wikipedia, http://web.archive.org/web/20180701000000*/https://en.wikipedia.org/wiki/Work_function, download date Sep. 23, 2018. (9 pages).

Cardwell "Photoelectric and Thermionic Properties of Nickel" Phys. Rev. vol. 76, No. 1 Jul. 1, 1949 pp. 125-127 (Year: 1949).

Electronic-Notes.com website page on Electrical Resistivity Table for Common Materials archived on Wayback Machine as of Aug. 19, 2018 cited herewith ( onl ine at https ://web.archive .org/web/20180819072947 /https ://www.electronics-notes.com/articles/basic_concepts/resistance/electrical-resistivity (Year: 2018).

Mitchell, E.W.J. "The work functions of copper, silver and aluminum" Proc. Of the Roy. Soc. A vol. 210, Iss. 1100 Dec. 7, 1951 p. 70-84 (Year: 1951).

* cited by examiner

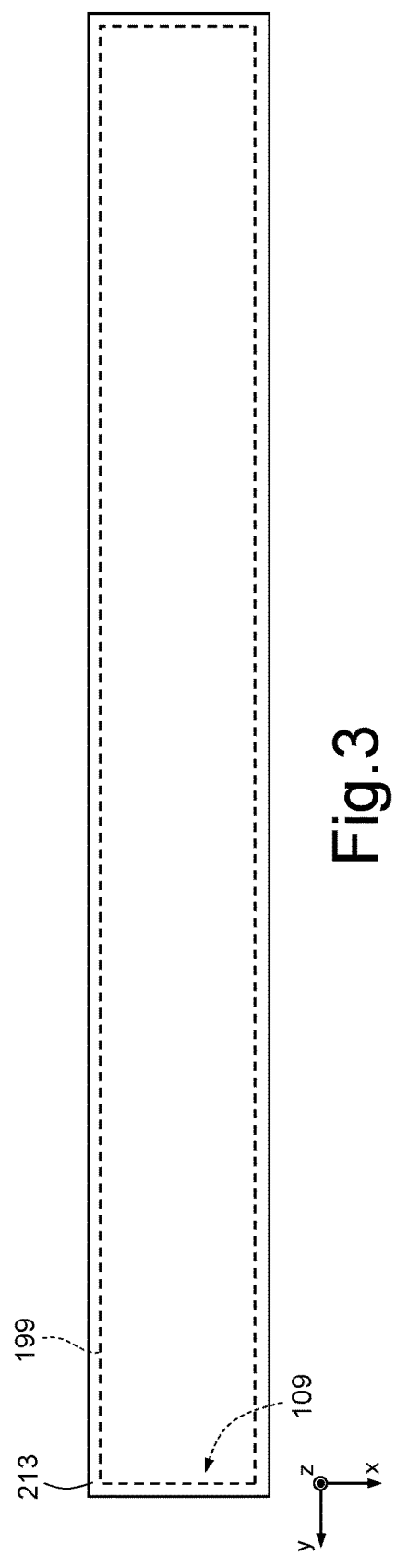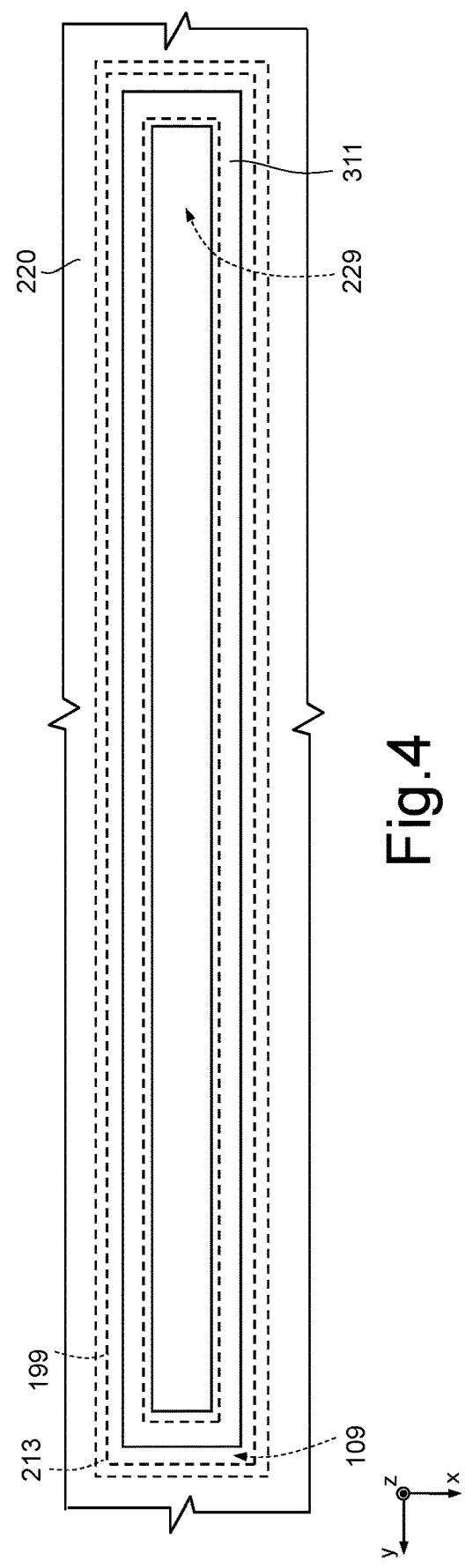

HEMT TRANSISTOR INCLUDING AN IMPROVED GATE REGION AND RELATED MANUFACTURING PROCESS

BACKGROUND

Technical Field

The present disclosure relates to a high electron mobility transistor (HEMT), which includes an improved gate region; moreover, the present disclosure regards the corresponding manufacturing process.

Description of the Related Art

As is known, HEMTs, which are also known as heterostructure field effect transistors (HFETs), are enjoying wide diffusion, since they are characterized by the possibility of operating at high frequencies, as well as presenting high breakdown voltages.

In greater detail, present in each HEMT is a semiconductive heterostructure, which enables generation, in an electronically controllable way, of a so-called 2-dimensional electron gas (2DEG), which constitutes the channel of the HEMT. Moreover, each HEMT comprises a gate region and the channel of the HEMT is modulated by the voltage present on the gate region.

For instance, FIG. 1 shows an HEMT 1, which comprises a semiconductor body 2, which in turn comprises a first layer 4 and a second layer 6, referred to in what follows as the bottom layer 4 and the top layer 6, respectively.

The bottom layer 4 is made of gallium nitride (GaN). The top layer 6 overlies the bottom layer 4, with which it is in direct contact, and is made of aluminum gallium nitride (AlGaN). Moreover, the bottom layer 4 and the top layer 6 are, for example, of an N type. Albeit not illustrated, the semiconductor body 2 further comprises a substrate, typically made of silicon, on which the bottom layer 4 is formed.

The HEMT 1 further comprises a passivation region 8, which overlies, in direct contact, the top layer 6 and is made of silicon nitride. The passivation region 8 forms a first surface $S_a$ of the HEMT 1. The top layer 6 is moreover delimited at the top by a second surface $S_b$, on which the passivation region 8 rests. In addition, the bottom layer 4 is delimited at the top by a third surface $S_c$, on which the top layer 6 rests.

The HEMT 1 further comprises a gate region 10, which extends in a cavity 15 and is made of conductive material. In particular, the cavity 15 extends through the passivation region 8, starting from the first surface $S_a$, has the shape of a parallelepiped, and is delimited at the bottom by the second surface $S_b$, so that the gate region 10 contacts the top layer 6.

The gate region 10 comprises a bottom portion 12, which is arranged in the cavity 15 and contacts the top layer 6, and a top portion 13, which is arranged on the first surface $S_a$ and overlies the bottom portion 12. Contact between the bottom portion 12 of the gate region 10 and the top layer 6 forms a metal-semiconductor junction of a Schottky type, i.e., a rectifying junction.

The HEMT 1 further comprises a source metallization 20 and a drain metallization 22, which are parallelepipedal in shape and are arranged, at a distance from one another, on opposite sides of the cavity 15. Each one of the source metallization 20 and the drain metallization 22 has a respective top portion, which extends on the first surface $S_a$, and a respective bottom portion, which extends through the passivation region 8 and the top layer 6, until it comes into contact with the third surface $S_c$, and hence with the bottom layer 4.

The top portion 13 of the gate region 10 has the shape of a parallelepiped and comprises a central part 13a, which overlies the bottom portion 12 of the gate region and a first side part 13b and a second side part 13c, which both have the shape of a parallelepiped and extend on opposite sides of the central part 13a. In particular, the first side part 13b extends between the central part 13a and the source metallization 20, at a distance from the latter, whereas the second side part 13c extends between the central part 13a and the drain metallization 22, at a distance from the latter. Moreover, assuming an orthogonal reference system xyz such that the plane xy is parallel to the first, second, and third surfaces $S_a$, $S_b$, $S_c$ and such that the source metallization 20, the gate region 10, and the drain metallization 22 are laterally staggered along the axis x, it is found that the length, measured along the axis x, of the second side part 13c is greater than the length of the first side part 13b. Moreover, the first side part 13b is spaced at a distance $D_{GS}$ (measured along the axis x) from the top portion of the source metallization 20, whereas the second side part 13c is spaced at a distance $D_{GD}$ (measured along the axis x) from the top portion of the drain metallization 22, with $D_{GD} > D_{GS}$.

Once again with reference to the gate region 10, this is formed by a stack of metal layers. Typically, the first layer, i.e., the layer that contacts the top layer 6 and forms the aforementioned Schottky junction, is made of nickel, on account of the high value of its work function. In addition, usually the gate region 10 includes at least one further low-resistance metal layer, which is made, for example, of gold and performs the function of reducing the gate resistance.

This having been said, when the HEMT 1 is off, i.e., when to the gate region there is applied a negative voltage (e.g., -3V), there may be an undesired drain current, known as "drain leakage current," referred to in what follows for brevity as leakage current.

In detail, the leakage current can flow through the Schottky junction, in the case of a reduction in the barrier of the junction. This undesired phenomenon may arise, for example, in the case where the process for manufacturing the HEMT 1, and in particular for providing one or more of layers of the gate region 10 arranged on the first layer, envisages the use of metal elements that have not particularly high work functions. This situation may arise when the use of metal elements with high work functions is precluded, for example for reasons of cost or else because their use could cause undesired contamination.

BRIEF SUMMARY

According to the present disclosure a HEMT and a manufacturing process are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 3-4 are schematic top plan views (not in scale) with portions removed of the HEMT illustrated in FIG. 2.

DETAILED DESCRIPTION

Figure 1:
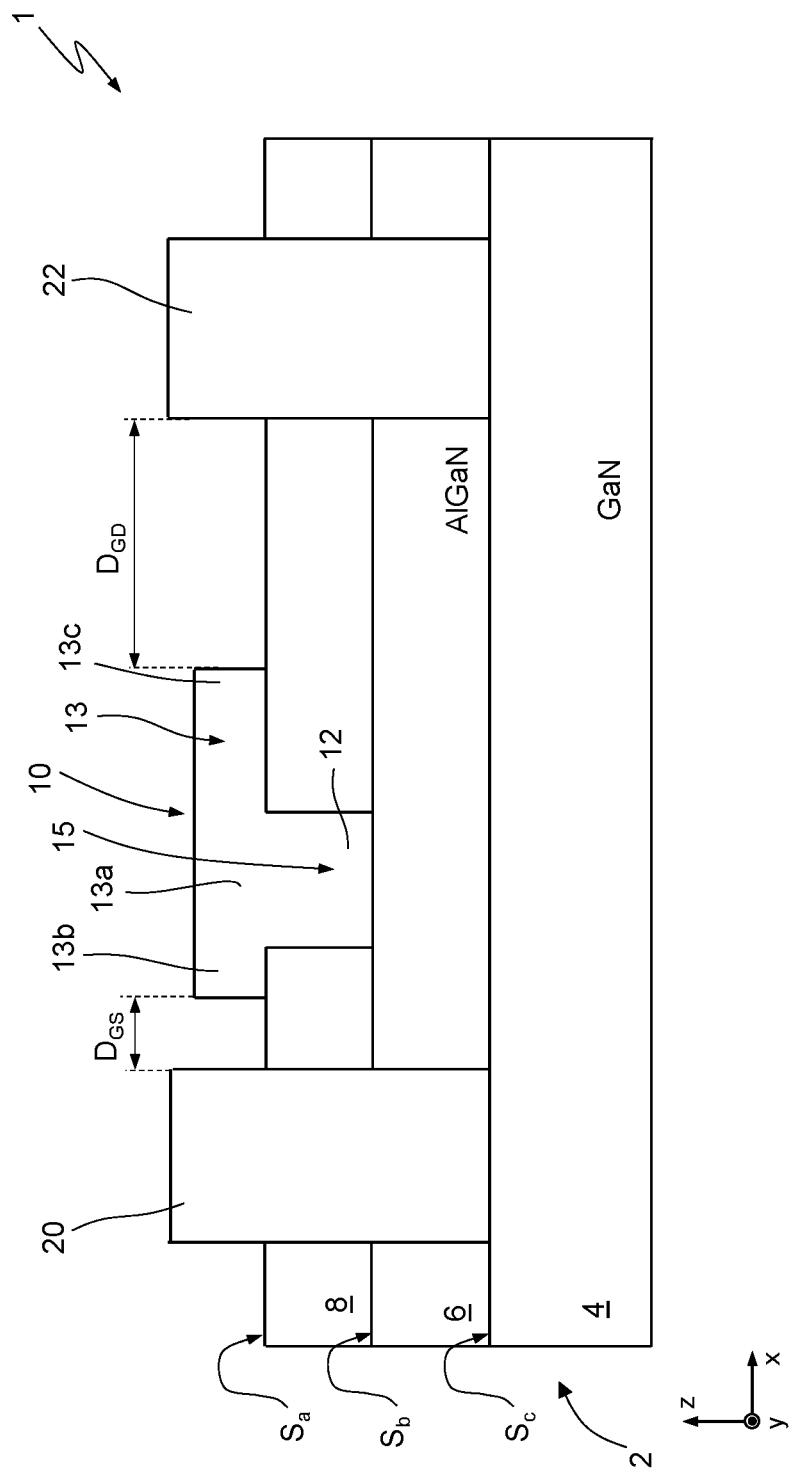
FIG. 1 is a schematic cross-section view (not in scale) of a HEMT.
Figure 2:
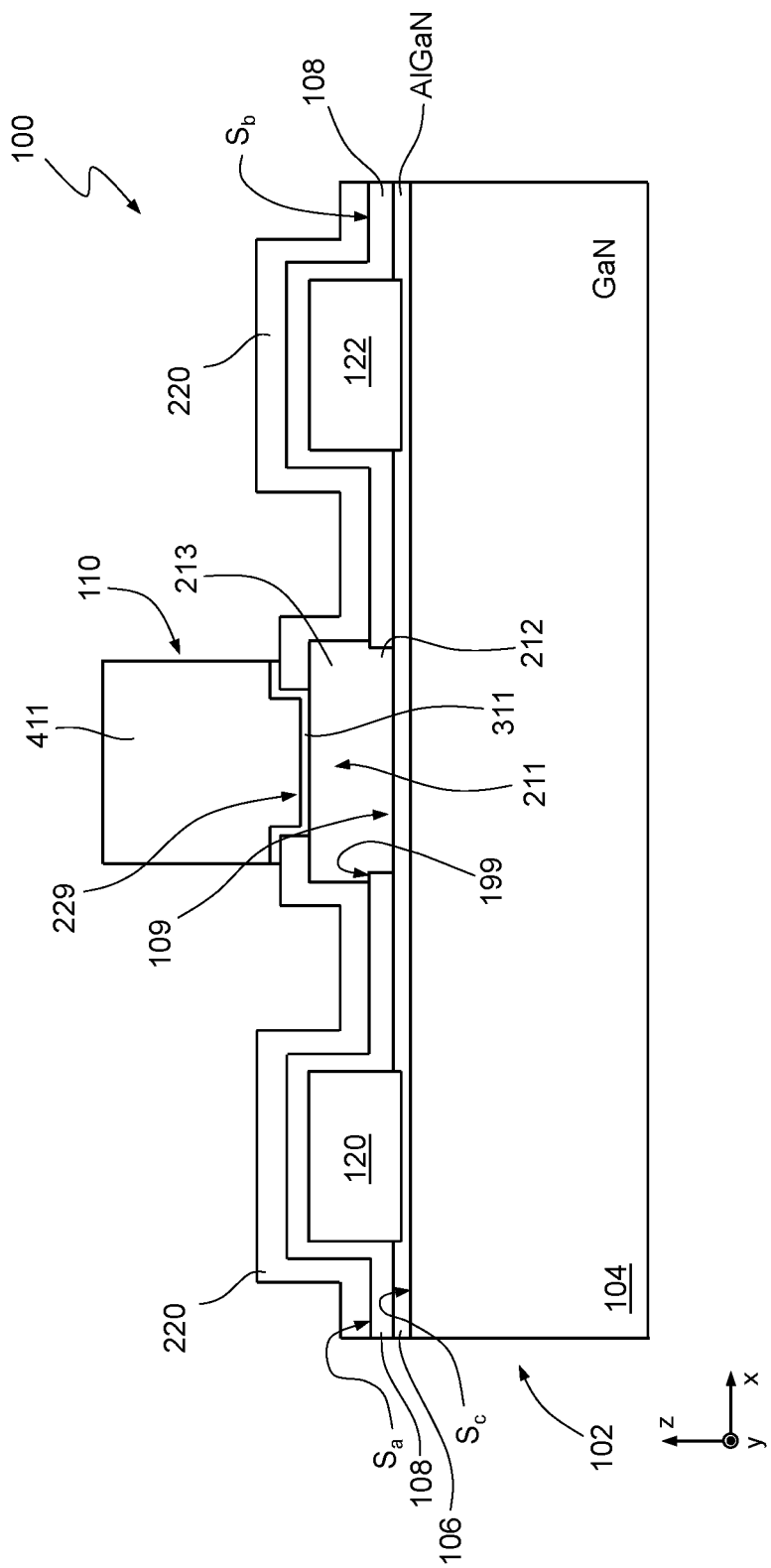
FIG. 2 is a schematic cross-section view (not in scale) of the present HEMT.

FIG. 2 shows an HEMT 100, which is described in what follows limitedly to the differences with respect to the HEMT 1 illustrated in FIG. 1, except where otherwise specified. Moreover, elements already present in the HEMT 1 are designated by the same reference numbers, increased by 100, except where otherwise specified. The first, second, and third surfaces are once again denoted by $S_a$, $S_b$, and $S_c$.

In detail, and without this implying any loss of generality, the source metallization 120 and the drain metallization 122 traverse the top layer 106 only partially. Consequently, the source metallization 120 and the drain metallization 122 overlie the bottom layer 104 at a distance therefrom.

In greater detail, each of the source metallization 120 and the drain metallization 122 has a respective top portion, which extends on the second surface $S_b$, and a respective bottom portion, which extends underneath the second surface $S_b$, within a top part of the top layer 106. In addition, the passivation region (designated by 108), referred to in what follows as the first dielectric layer 108, coats at the top and laterally the top portions of the source metallization 120 and of the drain metallization 122, in addition to the top layer 106.

The first dielectric layer 108 defines the first surface $S_a$, which is parallel to the plane xy and delimits at the top the part of the first dielectric layer 108 laterally staggered with respect to the source metallization 120 and to the drain metallization 122, this part being plane.

The HEMT 100 further comprises a first opening 109, which extends through the first dielectric layer 108, and in particular the aforementioned plane part of the first dielectric layer 108, giving out onto the top layer 106. The first opening 109 is hence delimited laterally by the first dielectric layer 108 and may have a substantially parallelepipedal shape. In this case, in top plan view, the first opening 109 has a rectangular shape. In this connection, to indicate the ensemble of the four edges of the first dielectric layer 108, which delimit the section of the first opening 109 in the plane of the first surface $S_a$, will be referred to in what follows as the broken line 199. The broken line 199 hence lies in the plane of the first surface $S_a$ and has a closed, rectangular, shape.

Without this implying any loss of generality, the gate region 110 is equidistant from the source metallization 120 and from the drain metallization 122.

The gate region 110 comprises a bottom region 211, made of nickel.

The bottom region 211 includes a respective bottom portion 212, which occupies the first opening 109 and hence extends underneath the first surface $S_a$, contacting the top layer 106. Moreover, the bottom region 211 comprises a respective top portion 213, which extends on the first surface $S_a$ so as to overlie the bottom portion 212.

The top portion 213 of the bottom region 211 comprises parts laterally staggered with respect to the first opening 109 so that the section of the first opening 109 in the plane of the first surface $S_a$ is entirely overlaid by the top portion 213. In particular, as illustrated in FIG. 3 (where for simplicity of representation just the top portion 213 and the first opening 109 are shown), the broken line 199, which forms the perimeter of the entrance of the first opening 109, is entirely overlaid by the top portion 213 of the bottom region 211, which to a first approximation has, for example, a parallelepipedal shape. In fact, the top portion 213 projects laterally, towards the outside, beyond the entire perimeter of the entrance of the first opening 109, defined precisely by the broken line 109. Equivalently, in top plan view, the broken line 199 is entirely contained within the top portion 213 of the bottom region 211 of the gate region 110.

Without this implying any loss of generality, the bottom region 211 of the gate region 110 has a thickness comprised between 30 nm and 200 nm.

The HEMT 100 further comprises a second dielectric layer 220, which is made of the same material as that of the first dielectric layer 108. The second dielectric layer 220 may hence be made, for example, of silicon nitride. Moreover, the second dielectric layer 220 overlies, in direct contact, the first dielectric layer 108.

A second opening 229 extends through the second dielectric layer 220, so as to expose a part of the top portion 213 of the bottom region 211 of the gate region 110. In practice, the second dielectric layer 220 coats at the top and laterally a peripheral portion of the top portion 213, leaving a central part of the top portion 213 exposed. Moreover, the first and second dielectric layers 108, 220 and the top layer 106 form a package that encapsulates the bottom region 211 of the gate region 110; the second opening 229 passes through this package.

The gate region 110 further comprises an intermediate region 311, which is made, for example, of tungsten nitride (WN) or else tantalum nitride (TaN) and has a thickness comprised, for example, between 40 nm and 100 nm. Moreover, the gate region 110 comprises at least one top region 411, which is made, for example, of aluminum, overlies the intermediate region 311, and has a thickness comprised, for example, between 300 nm and 700 nm.

In detail, the intermediate region 311 extends into the second opening 229 so as to coat the side walls and the bottom of the second opening 229, contacting the top portion 213 of the bottom region 211 of the gate region 110. In addition, as illustrated also in FIG. 4 (where for simplicity of representation only the intermediate region 311, the second dielectric layer 220, the second opening 229, the top portion 213, and the first opening 109), and without this implying any loss of generality, the intermediate region 311 also extends on portions of the second dielectric layer 220 that laterally delimit the second opening 229. In practice, the intermediate region 311 closes the aforementioned package.

For practical purposes, the bottom portion 212 of the bottom region 211 of the gate region 110 forms a Schottky contact with the top layer 106. The top region 411 of the gate region 110 functions as low-resistance region. In fact, it is made of a low-resistivity metal material (aluminum), which is commonly used in numerous technological processes (e.g., in the lines for manufacturing CMOS circuits) without generating contamination, unlike what occurs, for example, in the case of gold. The intermediate region 311 functions, instead, as barrier layer, which prevents the aluminum that forms the top region 411 from diffusing, through the bottom region 211, as far as into contact with the top layer 106, in particular in the presence of temperatures higher than 300° C.; were it to occur, the above diffusion of the aluminum into the top layer 106 would lead to damage to the Schottky junction on account of the relatively low value of the work function of aluminum.

The HEMT 100 may be manufactured, for example, with the manufacturing process described in what follows.

Figure 5:
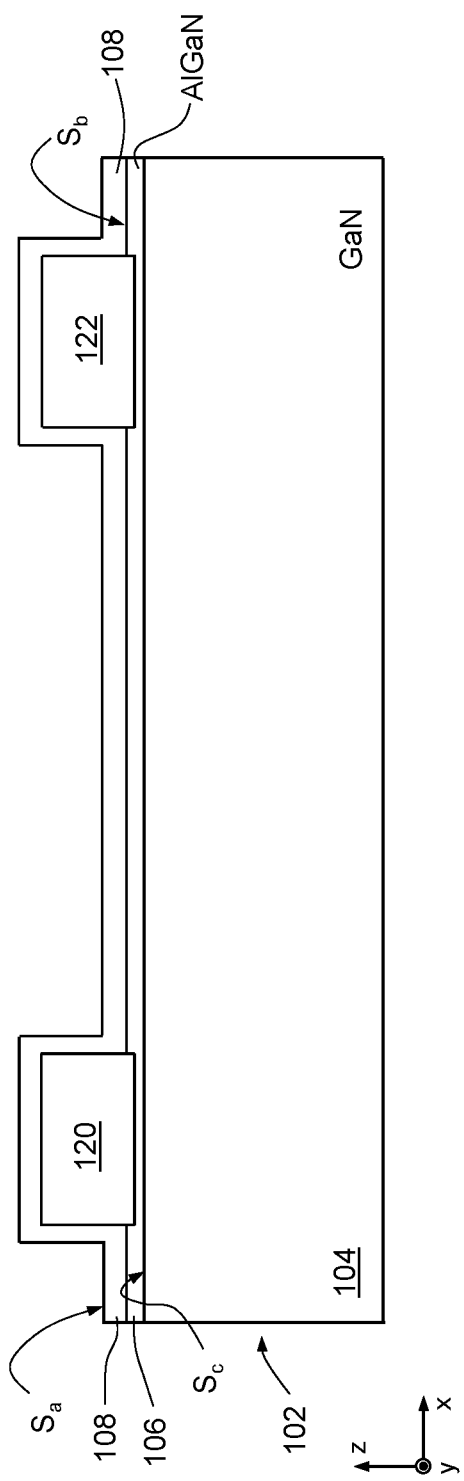
FIGS. 5-14 are schematic cross-section views (not in scale) of the HEMT illustrated in FIG. 2, during successive steps of a manufacturing process.

Initially, as illustrated in FIG. 5, formed in a way in itself known are the semiconductor body 102, the source metallization 120, the drain metallization 122, and the first dielectric layer 108, the latter coating entirely the top layer 106 in so far as it is without the first opening 109.

Figure 6:
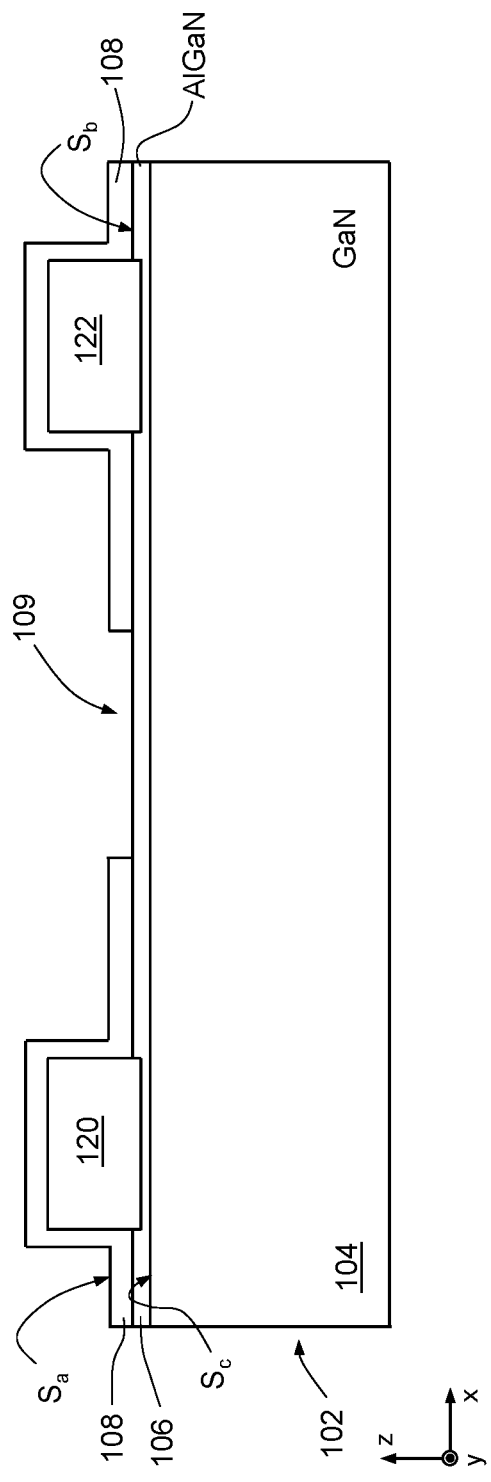

Next, as illustrated in FIG. 6, a portion of the first dielectric layer 108 is selectively removed, for example by means of a dry etch, so as to form the first opening 109, which exposes the top layer 106.

Figure 7:
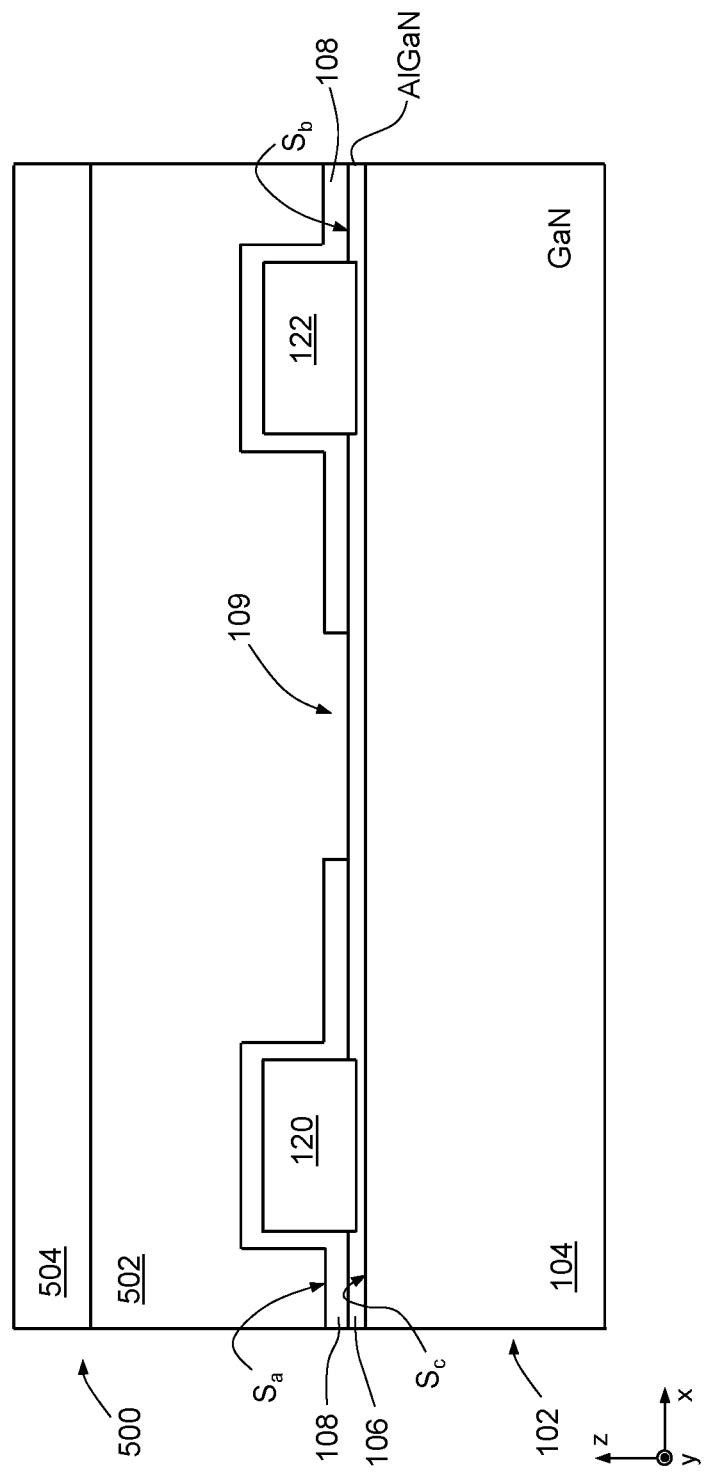

Then, as illustrated in FIG. 7, a temporary structure 500 is formed, which includes a first temporary layer 502 and a second temporary layer 504.

In detail, the first temporary layer 502 extends on the first dielectric layer 108 and fills the first opening 109 entirely. The second temporary layer 504 extends on the first temporary layer 502.

In greater detail, the first temporary layer 502 is formed by a non-photosensitive resist (e.g., a non-photosensitive organic material), whereas the second temporary layer 504 is formed by a photosensitive resist, so that the temporary structure 500 forms a so-called "bilayer," where the first temporary layer 502 forms the so-called "underlayer."

Figure 8:
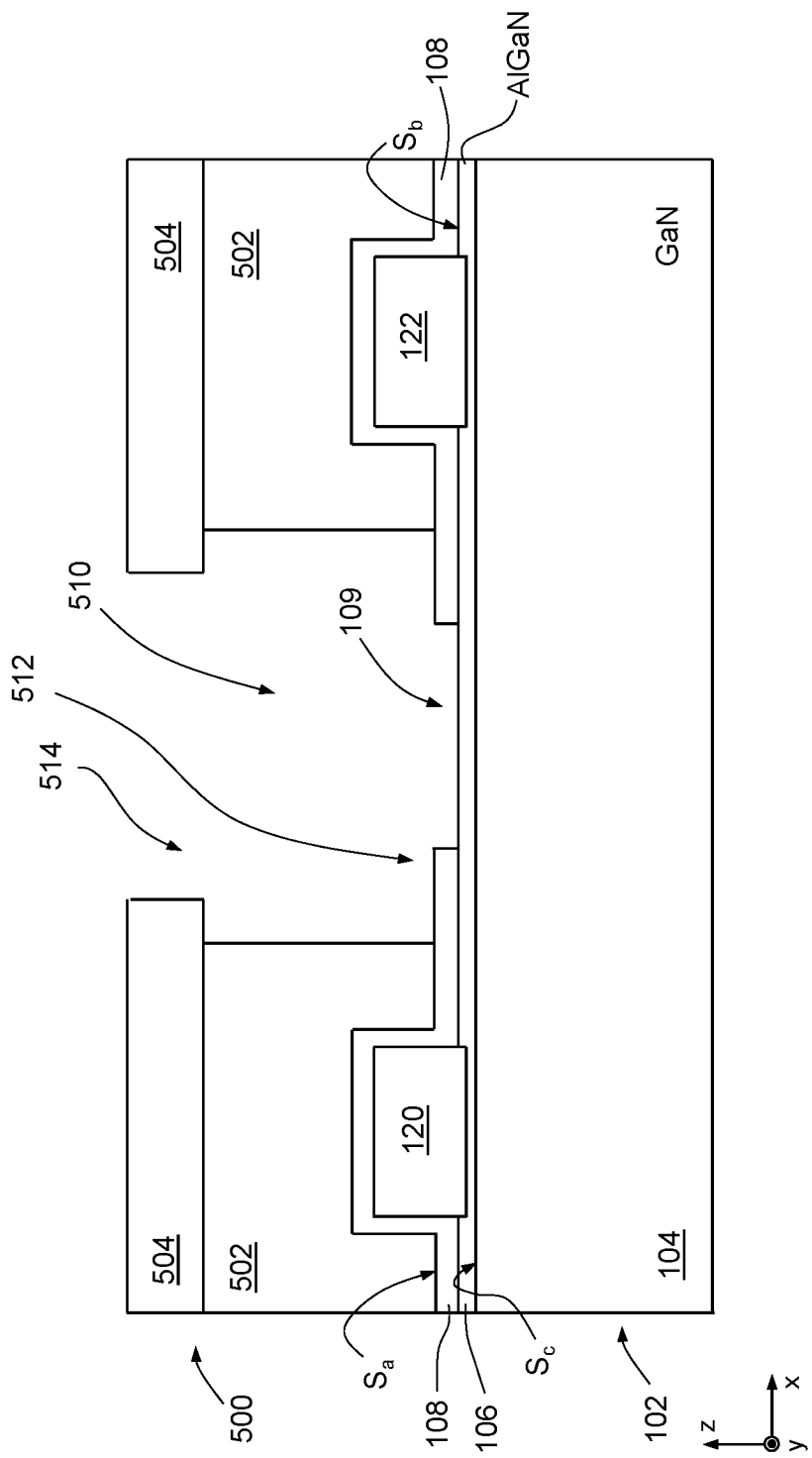

Next, in a way in itself known, a portion of the second temporary layer 504 (step not illustrated) is exposed to radiation, and then a chemical etch is carried out so as to obtain what is illustrated in FIG. 8.

In detail, a main cavity 510 is formed, which extends through the first and second temporary layers 502, 504. The main cavity 510 is formed by a through cavity 514, which traverses the second temporary layer 504, and by an underlying recess 512, which communicates with the overlying through cavity 514 and extends through the first temporary layer 502 in a way such as to expose a portion of the first dielectric layer 108, which delimits the first opening 109.

To a first approximation, both the through cavity 514 and the recess 512 are parallelepipedal. Moreover, the recess 512 communicates with the first opening 109. To a first approximation, the first opening 109, the recess 512, and the through cavity 514 are vertically aligned. Once again to a first approximation, the section of the recess 512 perpendicular to the axis z has dimensions along the axis x and the axis y greater than the corresponding dimensions of the section of the through cavity 514. Moreover, the section of the first opening 109 perpendicular to the axis z has dimensions along the axis x and the axis y smaller than the corresponding dimensions of the section of the through cavity 514.

In practice, the first opening 109 is entirely overlaid, at a distance, by the through cavity 514. In addition, part of the second temporary layer 504 extends in cantilever fashion; i.e., it projects, over the recess 512, so as to form a restriction. Equivalently, at the transition between first and second temporary layers 502, 406, the main cavity 510 has a section, perpendicular to the axis z, that widens from the top downwards.

Figure 9:
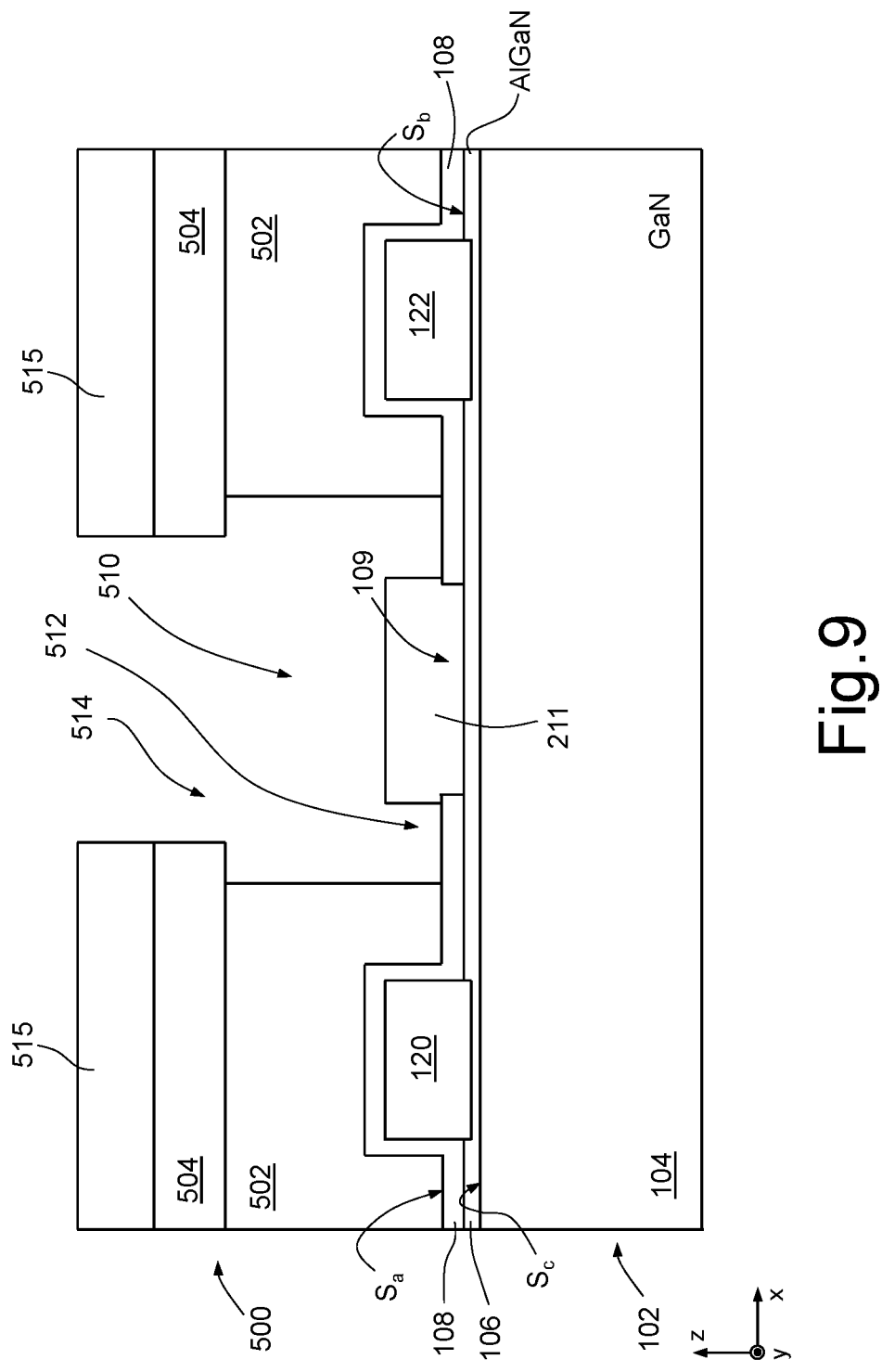

Next, as illustrated in FIG. 9, formed by physical vapor deposition (PVD) is the bottom region 211 of the gate region 110, which extends not only in the first opening 109, but also on part of the bottom of the recess 512, at a distance from the first temporary layer 502, as well as underneath the through cavity 514, hence without penetrating into the latter or contacting the second temporary layer 504. This operation likewise involves formation of a temporary nickel region 515, which extends on the second temporary layer 504 and is physically separate from the bottom region 211 of the gate region 110, as a result of the shape of the main cavity 510.

Figure 10:
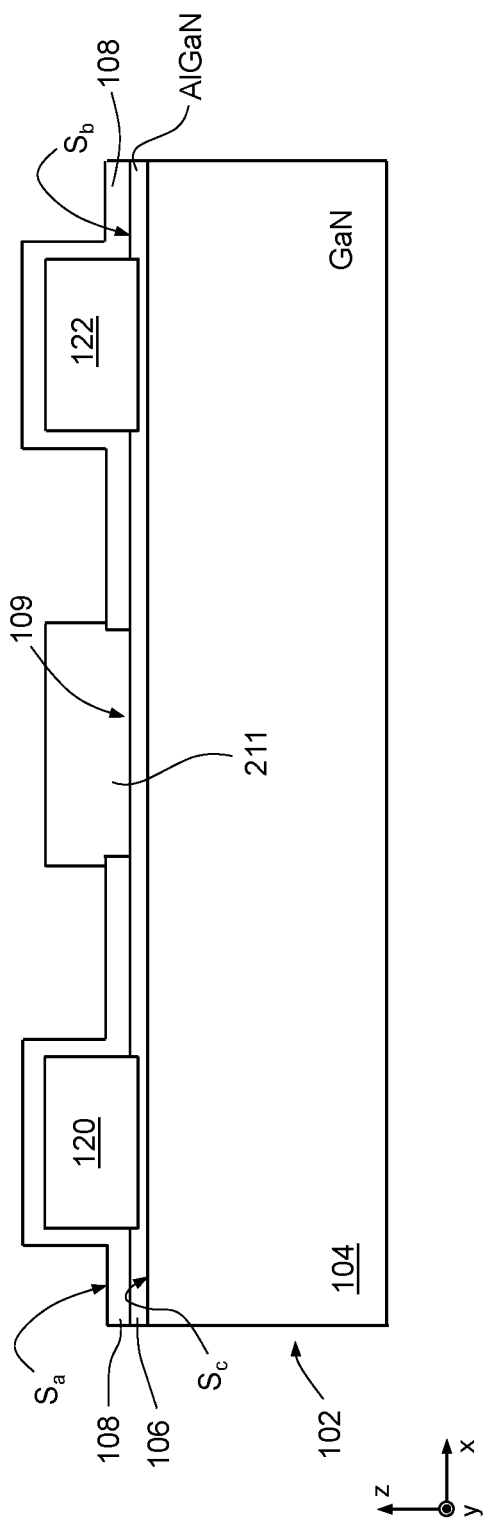

Next, there are performed a lift-off process in order to remove the temporary region 515, and a subsequent operation of removal of the temporary structure 500, so as to obtain what is illustrated in FIG. 10. Lift-off can take place thanks to the fact that the temporary region 515 is separate from the underlying bottom region 211 of the gate region 110.

Figure 11:
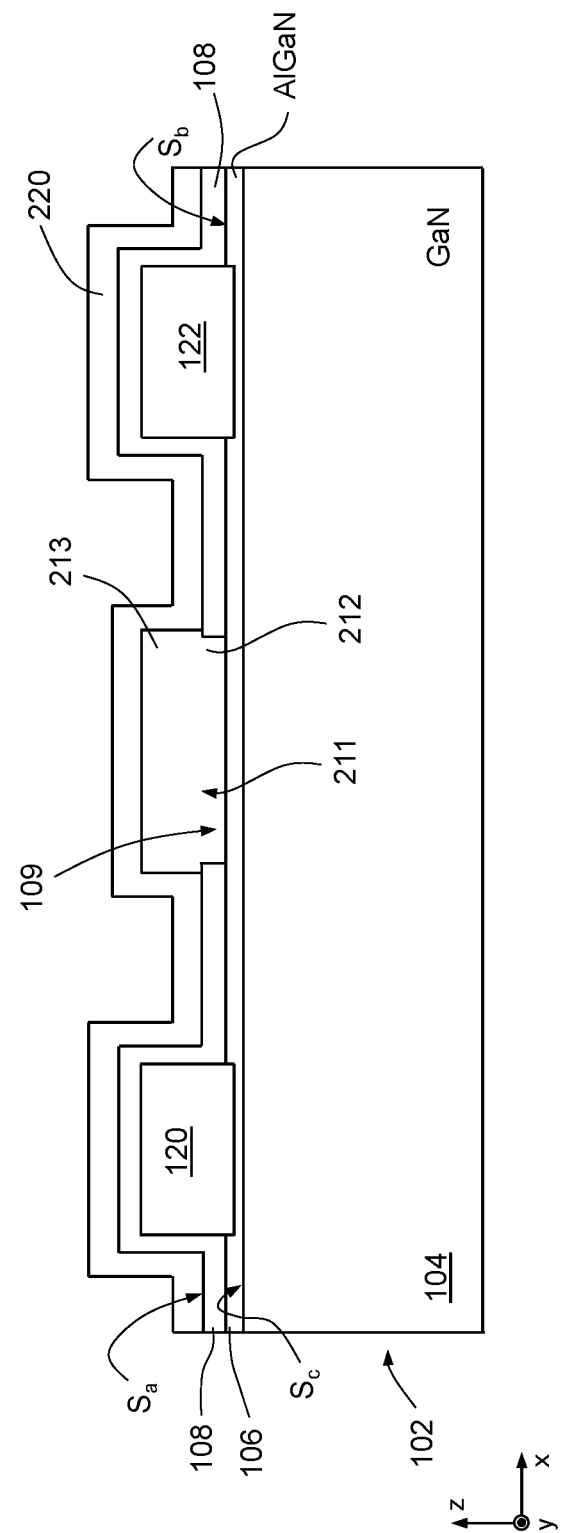

Then, as illustrated in FIG. 11, the second dielectric layer 220 is formed, for example by PECVD. The second dielectric layer 220 extends over the first dielectric layer 108 and on the bottom region 211 of the gate region 110. In particular, the second dielectric layer 220 coats at the top and laterally the top portion 213 of the bottom region 211 of the gate region 110.

Figure 12:
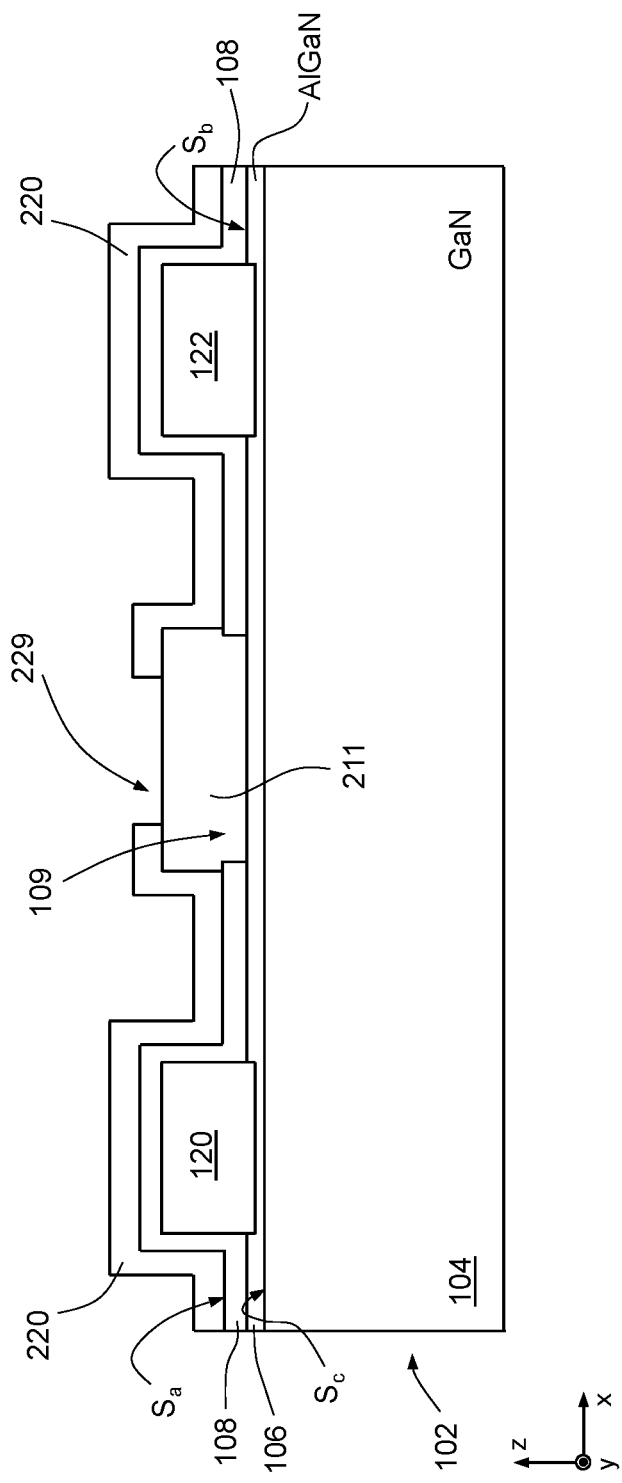

Next, a dry etch is carried out so as to remove selectively a portion of the second dielectric layer 220 arranged on the bottom region 211 of the gate region 110, so as to form the second opening 229, as illustrated in FIG. 12.

Figure 13:
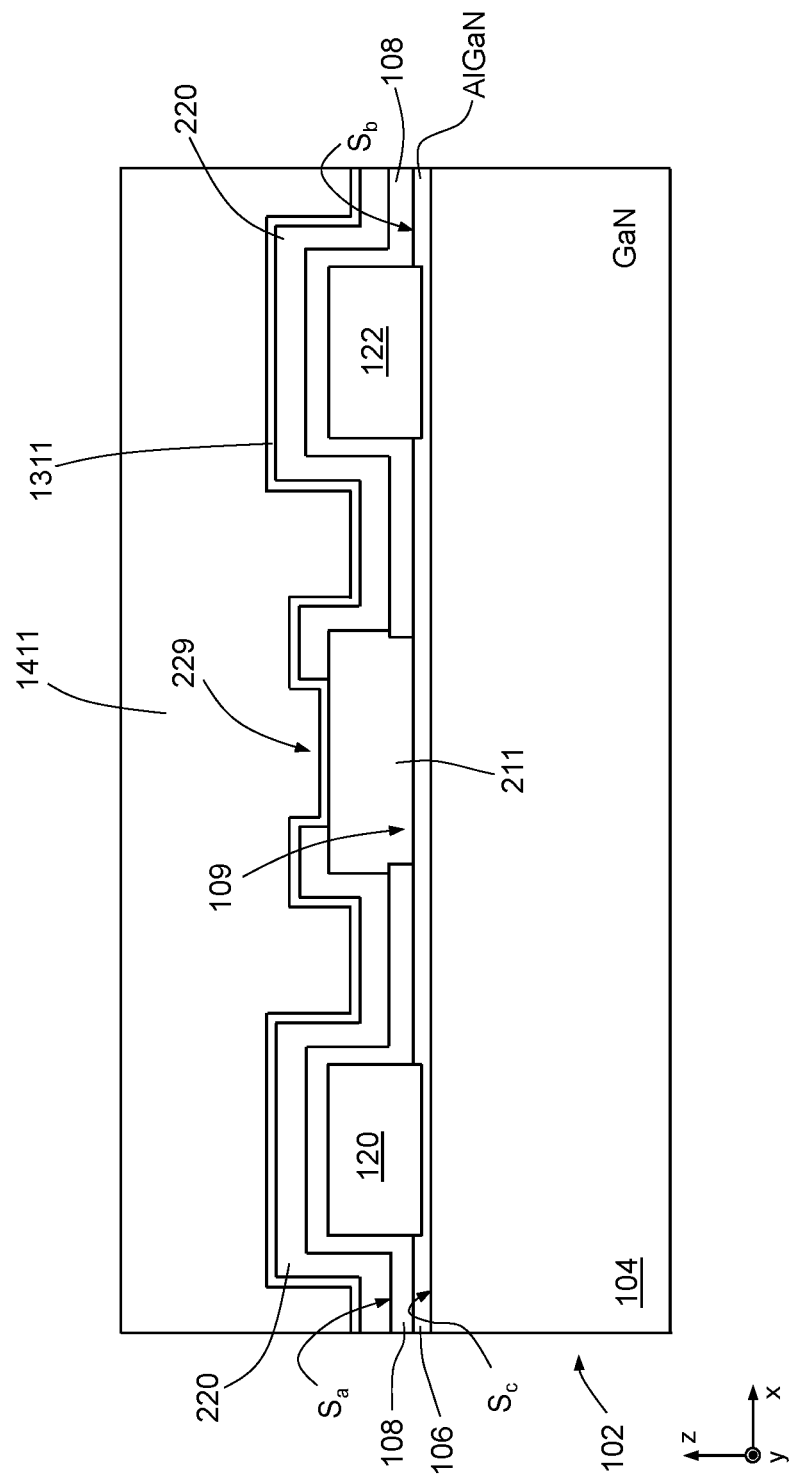

Then, two sputtering processes are carried out in succession, as illustrated in FIG. 13. In particular, a first process of sputtering of tungsten nitride (WN) or else of tantalum nitride (TaN) enables formation of a layer 1311, referred to in what follows as the first metal layer 1311; a subsequent second process of sputtering of aluminum enables formation of a layer 1411, referred to in what follows as the second metal layer 1411.

The first metal layer 1311 extends on the second dielectric layer 220 and coats the side walls and the bottom of the second opening 229. The second metal layer 1411 extends on the first metal layer 1311.

Figure 14:
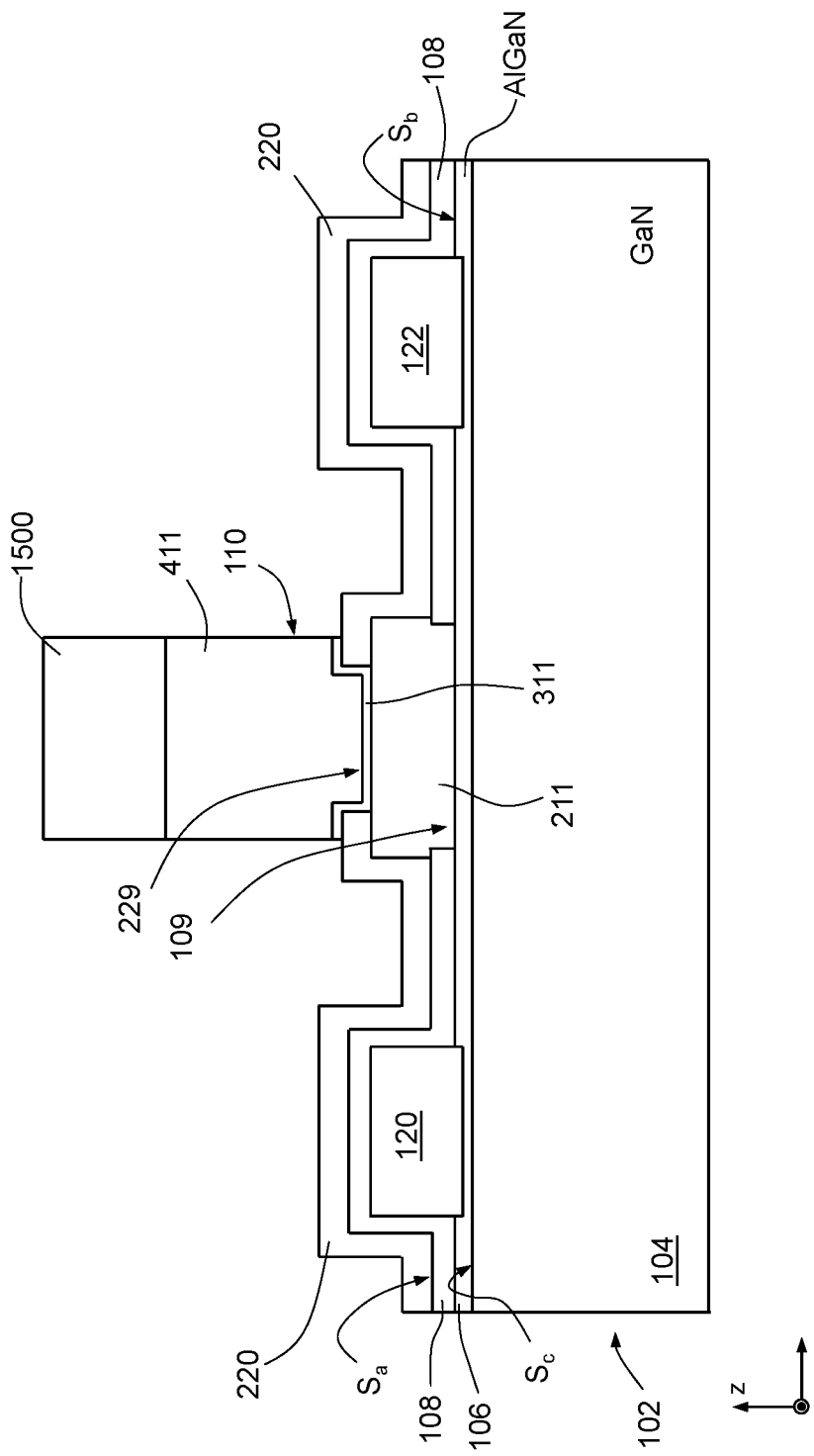

Next, portions of the second metal layer 1411, as well as underlying portions of the first metal layer 1311, are selectively removed via the use of a resist mask 1500, which is arranged on the second metal layer 1411. As illustrated in FIG. 14, the remaining portions of the first and second metal layers 1311, 1411 form the intermediate region 311 and the top region 411 of the gate region 110, respectively.

Then, in a way not illustrated, the resist mask 1500 is removed.

From what has been described and illustrated previously above, the advantages that the present solution affords emerge clearly.

In particular, the present HEMT has a gate region in which the low-resistivity subportion is made of a material that can be used on the most common lines for manufacturing integrated circuits, without giving rise to major contamination, hence without contaminating, for example, the manufacturing equipment. Moreover, even though this material may present a not particularly high work function, it does not involve risks of damage to the Schottky junction, thanks to the presence of the barrier layer.

In conclusion, it is clear that modifications and variations may be made to what has been described and illustrated herein, without thereby departing from the sphere of protection of the present disclosure.

For instance, the gate region 110 may include, on the top region 411, an additional metal region (not illustrated), made, for example, of titanium nitride and having the function of anti-reflection layer.

The additional metal region may be formed by carrying out a respective sputtering step, prior to execution of the etch illustrated in FIG. 14, said sputtering causing formation of a third metal layer (not illustrated) on the second metal layer 1411. In this case, the resist mask 1500 is then arranged on the third metal layer.

More in general, the gate region 110 may have further layers additional to the ones described.

The source metallization 120 and the drain metallization 122 may have shapes and arrangements different from what has been described. For instance, the source metallization 120 and the drain metallization 122 may penetrate in part into the bottom layer 104, or else may be arranged entirely on the top layer 106, albeit in contact with the latter.

The structure of the semiconductor body 102 may be different from what has been described.

For instance, the bottom layer 104 may include a respective top portion and a respective bottom portion (not illustrated), which are doped, for example, with carbon atoms. In this case, the top portion is doped with carbon atoms to a lesser extent than the bottom portion and functions as so-called channel layer, whereas the bottom portion of the bottom layer 104 functions as buffer layer.

Between the bottom layer 104 and the top layer 106 there may be present a spacer layer (not illustrated), made, for example, of aluminum nitride and having a small thickness, for example of 1 nm; the spacer layer serves to improve the mobility of the 2-dimensional electron gas.

Doping of the semiconductor body 102 may be of a type different from what has been described. For instance, the bottom layer 104 and the top layer 106 may be of a P type.

The HEMT may include passivation regions different from what has been described. Moreover, the present HEMT may be indifferently of the normally ON or normally OFF channel type.

The openings and the recesses may have shapes different from what has been described. For instance, the first opening 109, the through cavity 514, and the recess 512 may have sections of a circular shape, in which case the broken line 199 is replaced by a circular profile.

In addition, the bottom region 211, the intermediate region 311, and the top region 411 of the gate region 110 may be made of materials different from what has been described. For instance, the intermediate region 311 may be made of titanium-titanium oxynitride-titanium (TiTiONTi), instead of tantalum or tungsten nitride.

As regards, the manufacturing process, the main cavity 510 may have a shape different from the one described and/or may be formed in a different way. For instance, it is possible to use a so-called negative resist, instead of the temporary structure 500. In this case, the main cavity has an approximately flared shape, with section that widens from the top downwards.

Finally, the manufacturing process may be such that the bottom region 211 penetrates at least in part into the top layer 106. For this purpose, it is possible to add a dedicated etching step, after formation of the first opening 109.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a HEMT transistor, comprising:
   forming a semiconductor body that includes a semiconductor heterostructure; and
   forming a conductive gate region, wherein forming the conductive gate region comprises:
      forming a contact region made of a first metal material, which contacts the semiconductor body, thereby forming a Schottky junction with the semiconductor body;
      on the contact region, forming a barrier region made of a second metal material; and
      on the barrier region, forming a top region made of a third metal material, which has a resistivity lower than a resistivity of the first metal material;
   forming, on the contact region, a front dielectric subregion having a front opening that is open to the contact region; and wherein forming the barrier region includes extending the barrier region into the front opening and on at least part of the front dielectric subregion, wherein:
   forming the contact region includes carrying out a chemical vapor deposition of said first metal material;
   forming the barrier region includes carrying out, after forming said front dielectric subregion and said front opening, a first sputtering operation of the second metal material; and
   forming the top region includes carrying out a second sputtering operation of the third metal material.

2. The manufacturing process of claim 1, further comprising forming, on the semiconductor body, a bottom dielectric subregion, which delimits a bottom opening; and wherein forming the contact region comprises carrying out said chemical vapor deposition after forming said bottom opening, so that the contact region extends into the bottom opening and on part of the bottom dielectric subregion.

3. The manufacturing process of claim 2, wherein the bottom dielectric subregion and the front dielectric subregion are made of silicon nitride.

4. The manufacturing process of claim 2, wherein forming the contact region comprises:
   after forming the bottom dielectric subregion and the bottom opening, and prior to forming the front dielectric subregion, forming on the bottom dielectric subregion and the bottom opening a temporary dielectric structure, which laterally delimits a cavity that overlies the bottom opening;
   after forming said cavity, carrying out said chemical vapor deposition, thereby forming the contact region and an additional region, which extends on the temporary dielectric structure, is made of the first metal material and is separate from the contact region; and
   removing the additional region and the temporary dielectric structure after forming the contact region and the additional region; wherein forming the front dielectric subregion includes forming the front dielectric subregion after removing the additional region and the temporary dielectric structure.

5. The manufacturing process of claim 4, wherein:
   at least part of said cavity has a section that widens in a direction of the semiconductor body; and
   removing the temporary dielectric structure is carried out by a lift-off step.

6. A method of forming high electron mobility transistor, the method comprising:
   forming a semiconductor body including a semiconductor heterostructure having a top surface;
   forming a source region in contact with the semiconductor body;
   forming a first dielectric layer in contact with the source region and the semiconductor body and including a first opening;

forming a conductive gate region, including:
    forming a first metal material in contact with the first dielectric layer, the first metal material being positioned in the first opening and in contact with the semiconductor body in the first opening, wherein the first metal material and the semiconductor body are a Schottky junction, wherein the first metal material has a planar top surface vertically above and parallel to the top surface of the semiconductor heterostructure;
    forming a barrier region of a second metal material on the first metal material above the first opening; and
    forming a third metal material on the second metal material and having a resistivity lower than a resistivity of the first metal material; and
forming a second dielectric layer in contact with the first dielectric layer directly above the source region and in contact with a side surface of the first metal material and in contact with the top surface of the first metal material such that a portion of the first metal material is between the first dielectric layer and the second dielectric layer in a vertical direction, wherein the second dielectric layer has a second opening above the first metal material in the vertical direction, wherein the second metal material is in contact with a top surface of the second dielectric layer and is in contact with side surfaces of the second dielectric layer in the second opening and contacts the first metal material through the second opening, wherein the third metal material has a bottom surface in contact with the second metal material and lower than a top surface of the second dielectric layer.

7. The method of claim 6, comprising forming a bottom dielectric region, which extends on the semiconductor body and delimits a bottom opening, wherein the contact region extends into the bottom opening and on part of a bottom dielectric subregion.

8. The method of claim 6, wherein the third metal material has a work function lower than a work function of the first metal material.

9. The method of claim 6, wherein the barrier region is configured to prevent diffusion of the third metal material through the contact region.

10. The method of claim 6, wherein said first and third metal materials are nickel and aluminum, respectively; and said second metal material is a metal alloy containing nitrogen.

11. The method of claim 6, wherein the semiconductor heterostructure includes a surface layer of aluminum gallium nitride, and an inner layer of gallium nitride.

12. A method for forming a high electron mobility transistor, the method comprising:
    forming a semiconductor body including a semiconductor heterostructure;
    forming a contact region of a conductive gate region of a first metal material and contacting the semiconductor body, thereby forming a Schottky junction with the semiconductor body;
    forming a front dielectric layer extending on the contact region and delimiting a front opening that extends to the contact region; wherein a top region extends into the front opening;
    forming a barrier region of the conductive gate region of a second metal material and arranged on the contact region and extending into the front opening and on at least part of the front dielectric layer; and
    forming a top region of the conductive gate region extending on the barrier region and made of a third metal material having a resistivity lower than a resistivity of the first metal material, the barrier region being positioned between the contact region and the top region, wherein:
    forming the contact region includes carrying out a chemical vapor deposition of said first metal material;
    forming the barrier region includes carrying out, after forming said front dielectric layer and said front opening, a first sputtering operation of the second metal material; and
    forming the top region includes carrying out a second sputtering operation of the third metal material.

13. The method of claim 12, further comprising forming a bottom dielectric layer on the semiconductor body and delimiting a bottom opening, where the contact region extends into the bottom opening.

14. The method of claim 12, wherein the barrier region extends into the front opening and on at least part of said front dielectric layer.

15. The method of claim 12, wherein the third metal material has a work function lower than a work function of the first metal material.

16. The method of claim 12, wherein the barrier region is configured to prevent diffusion of the third metal material through the contact region.

17. The method of claim 12, wherein said first and third metal materials are nickel and aluminum, respectively; and said second metal material is a metal alloy containing nitrogen.

18. The method of claim 12, wherein the semiconductor heterostructure includes surface layer of aluminum gallium nitride, and an inner layer, which is made of gallium nitride.

* * * * *